(12) United States Patent
Lim et al.

(10) Patent No.: US 8,415,674 B2
(45) Date of Patent: Apr. 9, 2013

(54) SEMICONDUCTOR DEVICE AND METHOD OF FORMING THE SAME

(75) Inventors: Tai-Soo Lim, Seoul (KR); HyunSeok Lim, Suwon-si (KR); Shin-Jae Kang, Yongin-si (KR); Kyung-Tae Jang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 191 days.

(21) Appl. No.: 12/874,865

(22) Filed: Sep. 2, 2010

(65) Prior Publication Data

US 2011/0049646 A1   Mar. 3, 2011

(30) Foreign Application Priority Data

Sep. 3, 2009  (KR) .................. 10-2009-0083124

(51) Int. Cl.
*H01L 29/10* (2006.01)
(52) U.S. Cl. ............ 257/67; 257/686; 257/E27.064; 257/E29.126; 257/E25.006
(58) Field of Classification Search .......... 257/67, 257/686, E27.064, E29.126, E25.006
See application file for complete search history.

(56) References Cited

U.S. PATENT DOCUMENTS

| 7,220,673 B2 | 5/2007 | Xi et al. |
| 2007/0023794 A1* | 2/2007 | Kang et al. .......... 257/288 |

FOREIGN PATENT DOCUMENTS

| JP | 2008-160004 | 7/2008 |
| JP | 2008-171838 | 7/2008 |
| KR | 1020060058583 | 5/2006 |

* cited by examiner

*Primary Examiner* — Tan N Tran
(74) *Attorney, Agent, or Firm* — Myers Bigel Sibley & Sajovec

(57) ABSTRACT

Methods of forming a semiconductor device include forming an insulation layer on a semiconductor structure, forming an opening in the insulation layer, the opening having a sidewall defined by one side of the insulation layer, forming a first metal layer in the opening, at least partially exposing the sidewall of the opening by performing a wet-etching process on the first metal layer, and selectively forming a second metal layer on the etched first metal layer. An average grain size of the first metal layer is smaller than an average grain size of the second metal layer. Related semiconductor devices are also disclosed.

14 Claims, 14 Drawing Sheets

SEMICONDUCTOR DEVICE AND METHOD OF FORMING THE SAME

CROSS-REFERENCE TO RELATED APPLICATION

This U.S. non-provisional patent application claims priority under 35 U.S.C. §119 of Korean Patent Application No. 10-2009-0083124, filed on Sep. 3, 2009, the disclosure of which is hereby incorporated by reference in its entirety.

BACKGROUND

The present disclosure herein relates to semiconductor devices and methods of forming the same, and more particularly, to semiconductor devices including a metal pattern and methods of forming the same.

Due to various demands for consumer electronic devices, semiconductor devices embedded therein also need to be more compact and reliable. Accordingly, research continues to be performed that is directed to increasing the degree of integration and/or performance of semiconductor devices.

Techniques for storing more data in the same physical space may help to achieve a higher degree of integration and/or performance of semiconductor devices. To accomplish this, various attempts have been made to maintain the original properties of semiconductor devices while reducing the sizes of components in the semiconductor devices. However, reducing the size of semiconductor components is made more difficult by limitations in semiconductor device manufacturing equipment.

SUMMARY

The present disclosure relates to semiconductor devices with improved reliability and methods of forming the same.

Methods of forming a semiconductor device according to some embodiments include forming an insulation layer on a semiconductor structure, forming an opening in the insulation layer, the opening having a sidewall defined by one side of the insulation layer, forming a first metal layer in the opening, at least partially exposing the sidewall of the opening by performing a wet-etching process on the first metal layer, and selectively forming a second metal layer on the etched first metal layer. An average grain size of the first metal layer is smaller than an average grain size of the second metal layer.

The first metal layer and the second metal layer include a gate pattern, and the methods may further include forming an insulation pattern between the semiconductor structure and the gate pattern.

The methods may further include forming a plurality of openings in the insulation layer to define a plurality of gate interlayer insulation layers and forming a plurality of first and second metal layers in the respective plurality of openings to thereby define a plurality of gate patterns. Forming the gate interlayer insulation layers and the insulation pattern may include alternately stacking gate interlayer insulation layers and sacrificial layers on a substrate, forming the hole that penetrates the gate interlayer insulation layers and the sacrificial layers, removing the sacrificial layers, and forming the insulation pattern conformally in a space, where the sacrificial layers are removed, and the hole.

In still other embodiments, the methods may further include forming a barrier layer between the insulation pattern and the first metal layer, wherein the barrier layer is etched together with the first metal layer during the wet etching process.

In other embodiments, the insulation pattern may include a compound bonded by an ionic bond.

In yet other embodiments, the first metal layer and the second metal layer may include the same metal.

In further embodiments, a formation speed of the first metal layer may be faster than that of the second metal layer.

In still further embodiments, the forming of the first metal layer and the forming of the second metal layer may include supplying a first metal source and a first reducing gas in the opening and supplying a second metal source and a second reducing gas in the opening, respectively, the first metal source and the second metal source being formed of the same metal element.

In even further embodiments, the first metal source and the second metal source may be $WF_6$.

In yet further embodiments, the first reducing gas and the second reducing gas may include hydrogen atoms, hydrogen radicals, and/or hydrogen ions.

In yet further embodiments, the first reducing gas may be silane or diborane and the second reducing gas may be hydrogen gas.

In yet further embodiments, the forming of the insulation pattern and the opening may include forming an insulation layer on the semiconductor structure and performing an anisotropic-etching process on the insulation layer until the top surface of the semiconductor structure is exposed.

In yet further embodiments, the semiconductor structure may further include a conductive region exposed through the bottom of the opening and the first metal layer is electrically connected to the conductive region.

In yet further embodiments, the methods may further include: forming a variable resistance pattern that contacts the second metal layer and forming a third metal layer on the variable resistance pattern.

In other embodiments of the inventive concept, semiconductor devices include a substrate, gate interlayer insulation layers and gate patterns, which are stacked on the substrate alternately; a semiconductor structure extending upwardly from the substrate along sidewalls of the gate interlayer insulation layers and the gate patterns, and an insulation pattern between the gate patterns and the semiconductor structure, wherein the gate patterns comprise a first metal pattern and a second metal pattern, the first metal pattern being adjacent to the semiconductor structure, the second metal pattern being spaced apart from the semiconductor structure by the first metal pattern.

In some embodiments, an average grain size of the first metal pattern may be smaller than an average grain size of the second metal pattern.

In other embodiments, the insulation pattern may extend on the top and bottom surfaces of the gate patterns.

In still other embodiments, the second metal pattern may extend on a second sidewall facing a first sidewall of the gate patterns adjacent to the semiconductor structure; the second metal pattern protruding more than the insulation patterns on the second sidewall of the gate patterns.

In even other embodiments, the semiconductor devices may further include a barrier layer between the first metal pattern and the insulation pattern, where one side of the barrier layer is coplanar with one side of the first metal pattern.

In yet other embodiments, the insulation pattern may include Oxide-Nitride-Oxide-AluminumOxide (ONOA).

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1:
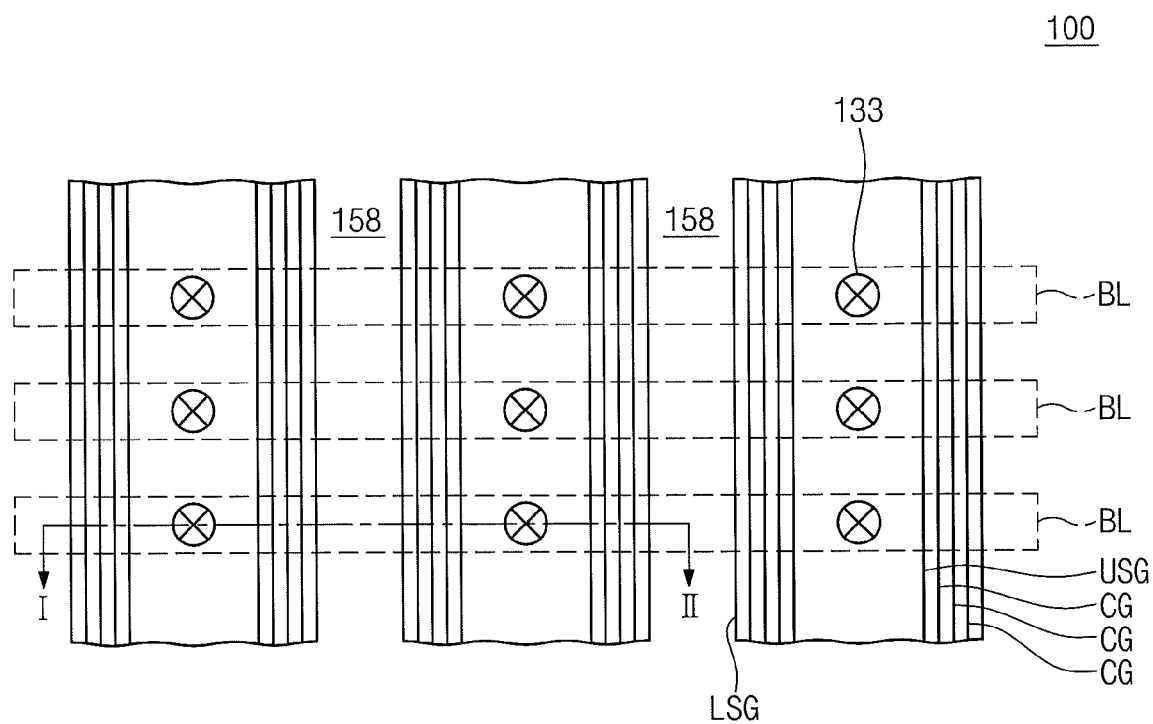
FIG. 1 is a plan view illustrating a semiconductor device according to some embodiments of the inventive concept.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly form formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below," "above," "upper," "lower," "horizontal," "lateral," "vertical," "beneath," "over," "on," etc., may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted regions. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Referring to FIGS. 1, 2A through 2F, and 3, methods of forming semiconductor devices according to some embodiments of the inventive concept will be described. FIG. 1 is a plan view illustrating a semiconductor device according to some embodiments of the inventive concept. FIGS. 2A through 2F and FIG. 3 are manufacturing sectional views of a semiconductor device taken along the line I-II of FIG. 1 according to some embodiments of the inventive concept.

Referring to FIGS. 1 and 2, a semiconductor substrate 100 (hereinafter, referred to as a substrate) is provided. The semiconductor substrate 100 may include a bulk semiconductor, an epitaxial semiconductor layer, a silicon on insulator (SOI) layer or other semiconductor structure. The substrate 100 may include a well region doped with dopants. An insulation layer 121 is formed on the substrate 100.

Sacrificial layers SC and gate interlayer insulation layers 123 are alternately stacked on the underlying insulation layer 121. The gate interlayer insulation layers 123 may be formed of the same material as the underlying insulation layer 121. The gate interlayer insulation layers 123 and the sacrificial layers SC may include materials having respectively different etch selectivities with respect to an etch solution. For example, when the gate interlayer insulation layers 123 include an oxide, the sacrificial layers SC may include a nitride. An upper insulation layer 125 may be formed on the uppermost sacrificial layer SC. The upper insulation layer 125 may include the same insulation material as the gate interlayer insulation layers 123.

The insulation layers 121, 123, and 125 and the sacrificial layers SC are anisotropically etched to form a hole 130 that penetrates the insulation layers 121, 123, and 125 and the sacrificial layers SC. The hole 130 penetrates the above layers, and may be formed vertically from the plane surface of the substrate 100. In other embodiments, instead of the hole 130, a groove that penetrates the insulation layers 121, 123, and 125 and the sacrificial layers SC and extends along a first direction of the substrate 100 may be formed.

A semiconductor structure 133 may be formed in the hole 130. The semiconductor structure 133 may include a semiconductor element such as, for example, a semiconductor material that includes group IV elements of the periodic table, although it will be appreciated that other types of semiconductor materials can be used. The semiconductor structure 133 may include a semiconductor element of a single crystal or polycrystalline state. In particular embodiments, the semiconductor structure 133 may include an active pattern in which a channel region of a transistor is formed.

The semiconductor structure 133 may be a pillar type structure that fills the hole 130. In other embodiments, the semiconductor structure 133 may have a shell form with an inner space. In that case, the inner space may be filled by an insulation layer. When a groove is formed instead of the hole 130, a semiconductor layer for filling the groove is formed, and then is patterned, such that the semiconductor structure 133 having a pillar form may be formed.

An impurity region 135 may be formed on a top portion of the semiconductor structure 133. The impurity region 135 may be formed, for example, by implanting dopants into the top portion of the semiconductor structure 133. In other embodiments, the impurity region 135 may be formed by performing an in-situ process, such as a diffusion doping process.

Figure 2A:
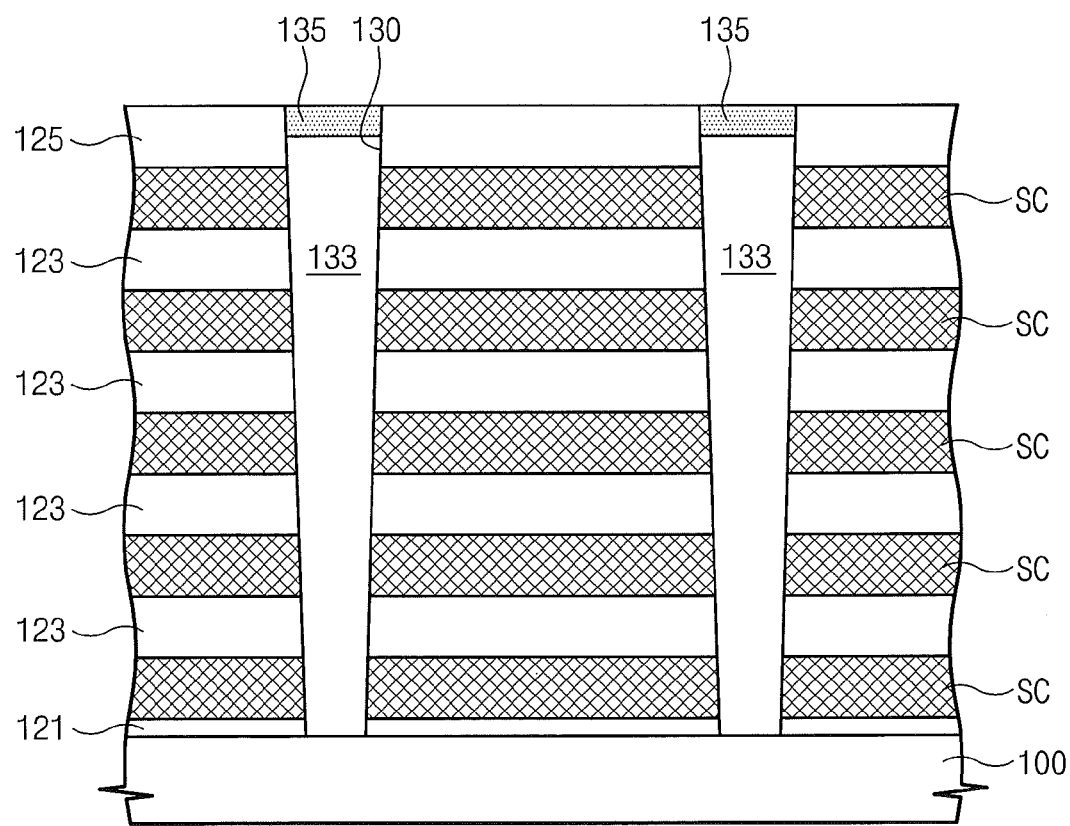
FIGS. 2A through 2F are manufacturing sectional views taken along the line I-II of FIG. 1 illustrating methods of forming semiconductor devices according to some embodiments of the inventive concept.
Figure 2B:
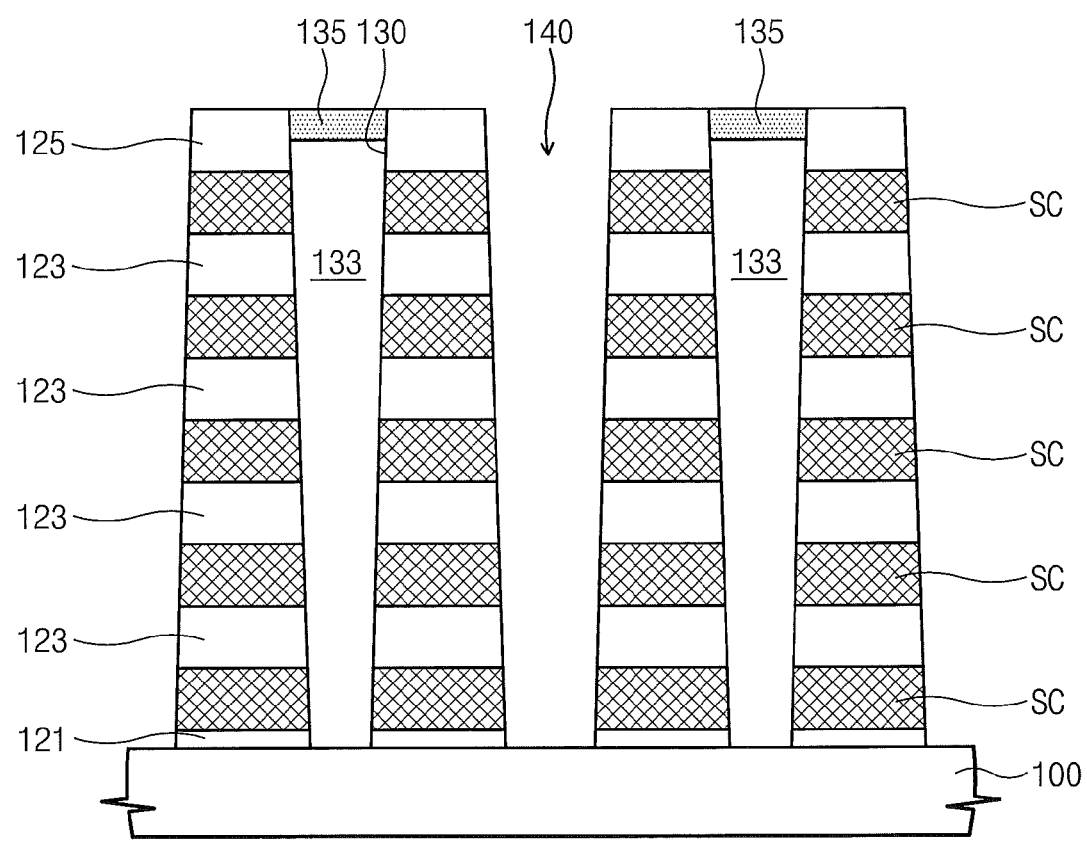

Referring to FIG. 2B, an optional groove 140 that penetrates the insulation layers 121, 123, and 125 and the sacrificial layers SC may be formed by patterning the insulation layers 121, 123, and 125 and the sacrificial layers SC. The groove 140 may extend in a first direction that is parallel to the top (plane) surface of the substrate 100. The top surface of the substrate 100 and the sidewalls of the insulation layers 121, 123, and 125 and the sacrificial layers SC may be exposed by the groove 140.

The groove 140 and the hole 130 may have slanted sidewalls. This is because the total thickness of layers, which are etched by an anisotropic etching process for forming the groove 140 and the hole 130, is thick. In other embodiments, if the total thickness of the insulation layers 121, 123, and 125 and the sacrificial layers SC is appropriately adjusted, the sidewalls of the groove 140 and the hole 130 may be substantially vertical to the top surface of the substrate 100.

Figure 2C:
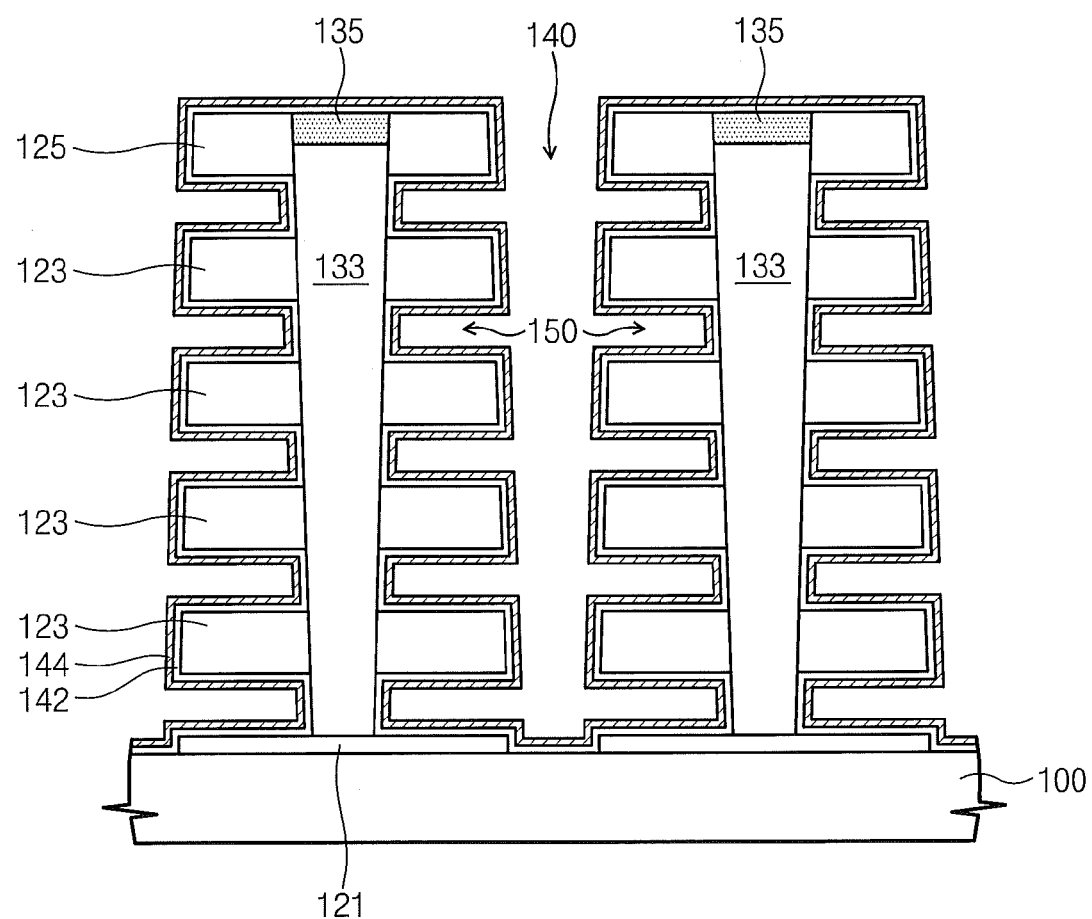

Referring to FIG. 2C, the sacrificial layers SC are removed. When the sacrificial layers SC include a nitride, they may be removed, for example, by a wet etching process using H3PO4 solution as an etching solution. Openings 150 may be formed between the insulation layers 121, 123, and 125 by removing the sacrificial layers SC. Portions of the sidewall of the semiconductor structure 133 may be exposed by the openings 150. In addition, the top surface of the underlying insulation layer 121 and the top surfaces and the bottom surfaces of the gate interlayer insulation layers 123 and the upper insulation layer 125 may be exposed by the openings 150.

An insulation pattern 142 is formed in the groove 140 and the openings 150. The insulation pattern 142 may conformally cover the sidewalls of the groove 140 and the openings 150. The insulation pattern 142 may be formed on the sidewall portions of the semiconductor structure 133 exposed by the openings 150. The insulation pattern 142 may cover the top surfaces and bottom surfaces of the gate interlayer insulation layers 123 and the upper insulation layer 125 and the top surface of the underlying insulation layer 121. The insulation pattern 142 may be formed on the sidewalls of the insulation layers 121, 123, and 125. The insulation pattern 142 on the top surfaces and the bottom surfaces of the insulation layers 121, 123, and 125 may define the sidewalls of the openings 150.

The insulation pattern 142 may include a plurality of insulation layers. In some embodiments, the insulation pattern 142 may include a charge storage layer. For example, the insulation pattern 142 may include an oxide-nitride-oxide (ONO) layer or an oxide-nitride-oxide-aluminum oxide (ONOA) layer. In some embodiments, the nitride layer may serve as a charge storage layer in a nonvolatile semiconductor memory device.

A barrier layer 144 may be formed on the insulation pattern 142. The barrier layer 144 may be conformally formed on the bottoms and sidewalls of the groove 140 and the openings 150. The barrier layer 144 may be formed to have a thickness of less than about 100 Å. For example, the barrier layer 144 may be formed to have a thickness of less than about 50 Å. The barrier layer 144 may include a metal nitride. For example, the barrier layer 144 may include tungsten nitride (WN) or titanium nitride (TiN).

Figure 2D:
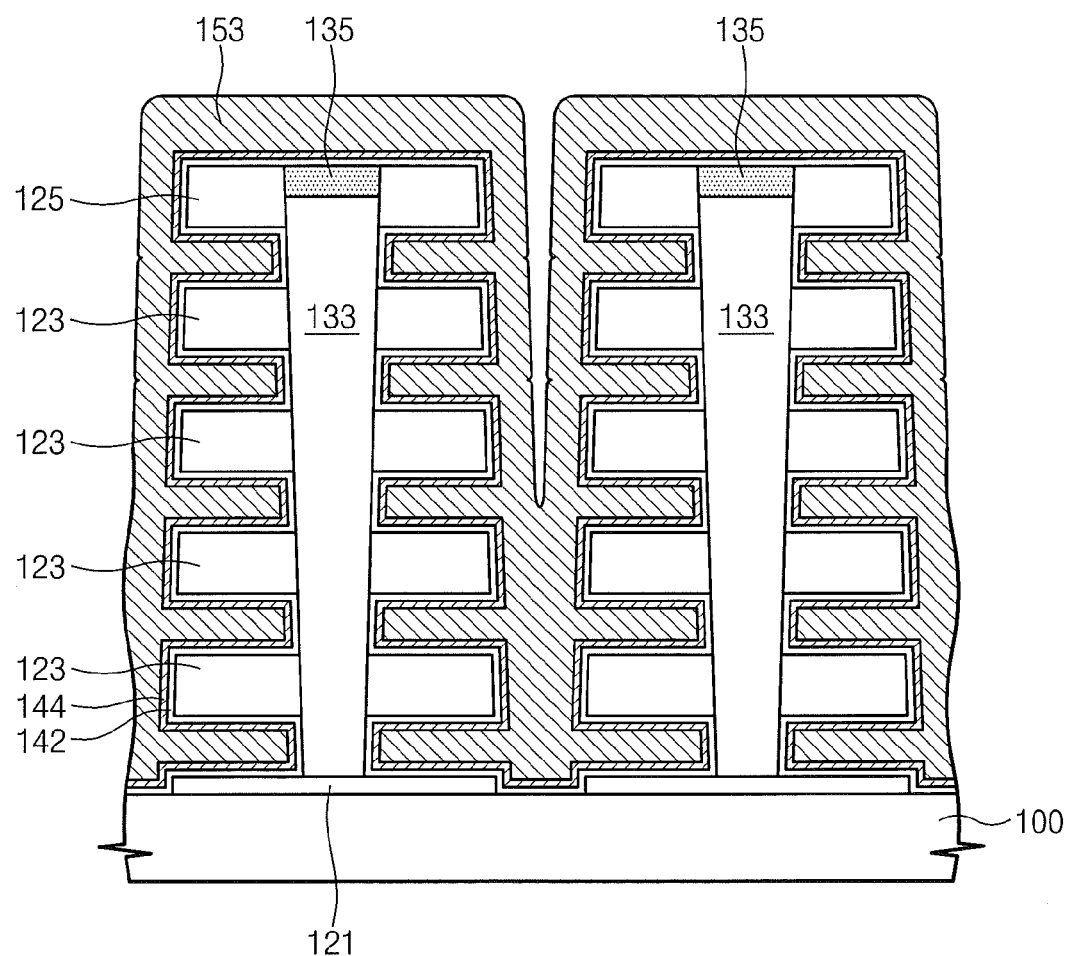

Referring to FIG. 2D, a first metal layer 153 may be formed in the openings 150 and the groove 140. The first metal layer 153 may fill a portion of the groove 140.

Forming the first metal layer 153 may include providing a first metal source and a first reducing gas in the openings 150 and the groove 140. The first metal source may include a first metal. For example, the first metal source may be a compound including a transition metal. The first reducing gas reduces the metal included in the first metal source. For example, the first reducing gas may include a chemical species that supplies hydrogen gas, hydrogen radicals, and/or hydrogen ions.

In some embodiments, the first metal source may include $WF_6$ and the first reducing gas may include $SiH_4$ and/or $B_2H_6$. When the first metal source and the first reducing gas are supplied to a reaction chamber into which the substrate 100 including the structure of FIG. 2C is loaded, a reaction corresponding to a chemical formula 1 below may occur.

$$2WF_6 + 3SiH_4 \rightarrow 2W + 3SiF_4 + 6H_2 \quad \text{(chemical formula 1)}$$

$WF_6$ corresponds to the first metal source and $SiH_4$ corresponds to the first reducing gas in the chemical formula 1. The reaction of the first metal source and the first reducing gas may be relatively fast. Accordingly, the first metal layer 153 may be deposited with a fast speed in the openings 150 and the groove 140. As a consequence, the grain size of the first metal layer 153, which is deposited at a fast speed, may be relatively small.

Figure 2E:
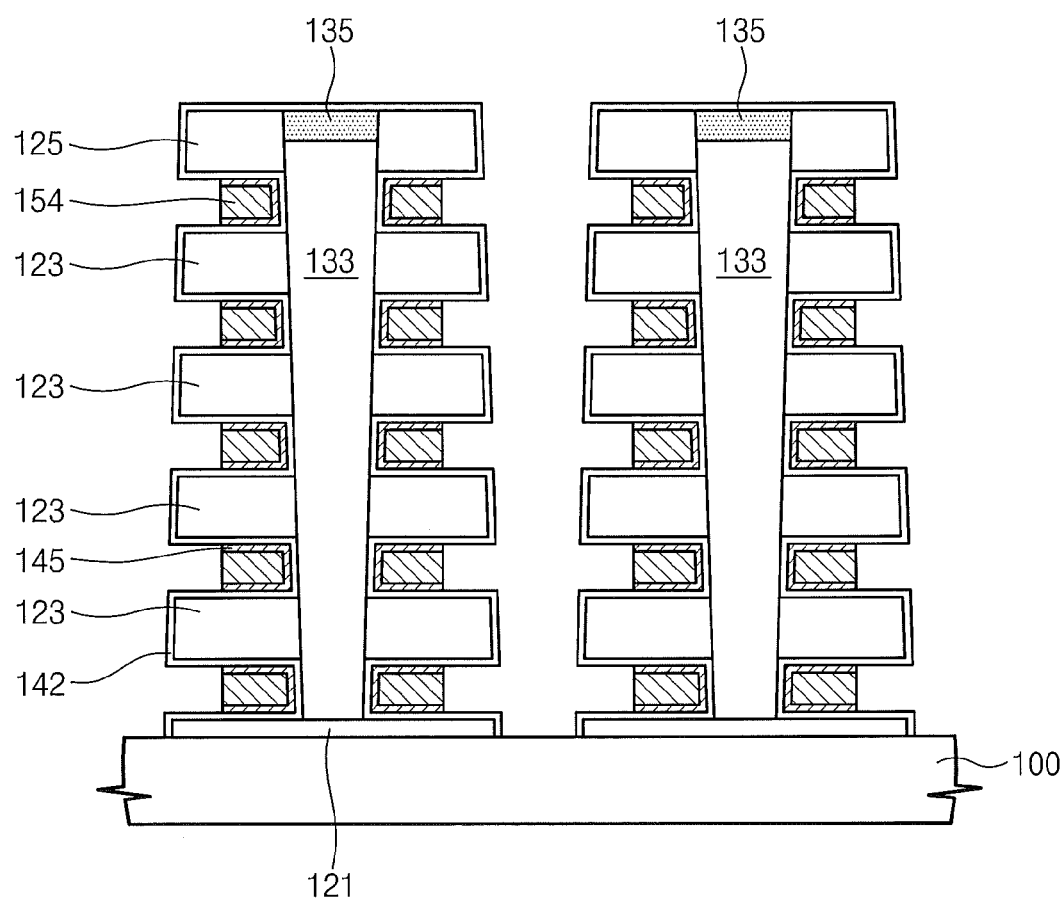

Referring to FIG. 2E, a portion of the first metal layer 153 is etched to form first metal patterns 154 in the openings 150. The first metal layer 153 may be wet-etched. For example, the first metal layer 153 may be etched by an etching solution including at least one of $H_2O_2$, $H_3PO_4$, $HNO_3$, $CH_3COOH$, HF, HCl, $H_2SO_4$, EKC, $SF_6$, $Cl_2$, and/or $NF_3$. One first metal pattern 154 is formed in each opening by etching the first metal layer 153. Accordingly, node isolation of the first metal layer 153 may occur due to the wet etching. That is, first metal patterns 154 in adjacent openings 150 may be insulated from one another.

Since the first metal layer 153 is etched by the wet etching, etching byproducts, which are generated during the etching process of the first metal layer 153, may be reduced and/or prevented from polluting the surface of the insulation pattern 142. In addition, as the first metal layer 153 has a relatively small grain size, etching damage caused by the wet etching can be reduced. A cleaning process may be additionally performed after the wet etching. Dangling bonds on the insulation pattern 142 may be removed by the wet etching process and/or the cleaning process.

During the etching of the first metal layer 153, the barrier layer 144 may be etched along with the first metal layer 153 to form a barrier pattern 145. Portions of the insulation pattern 142 that define upper and lower sidewalls of the openings 150 may be exposed by the etching of the barrier pattern 145. The etched surface of the barrier pattern 145 and the etched surface of the first metal pattern 154 may be coplanar.

The etched surfaces of the first metal pattern 154 and the barrier pattern 145 may be disposed further inside the openings 150 than a surface of the insulation pattern 142 that contacts the sidewalls of the gate interlayer insulation layer 123.

Figure 2F:
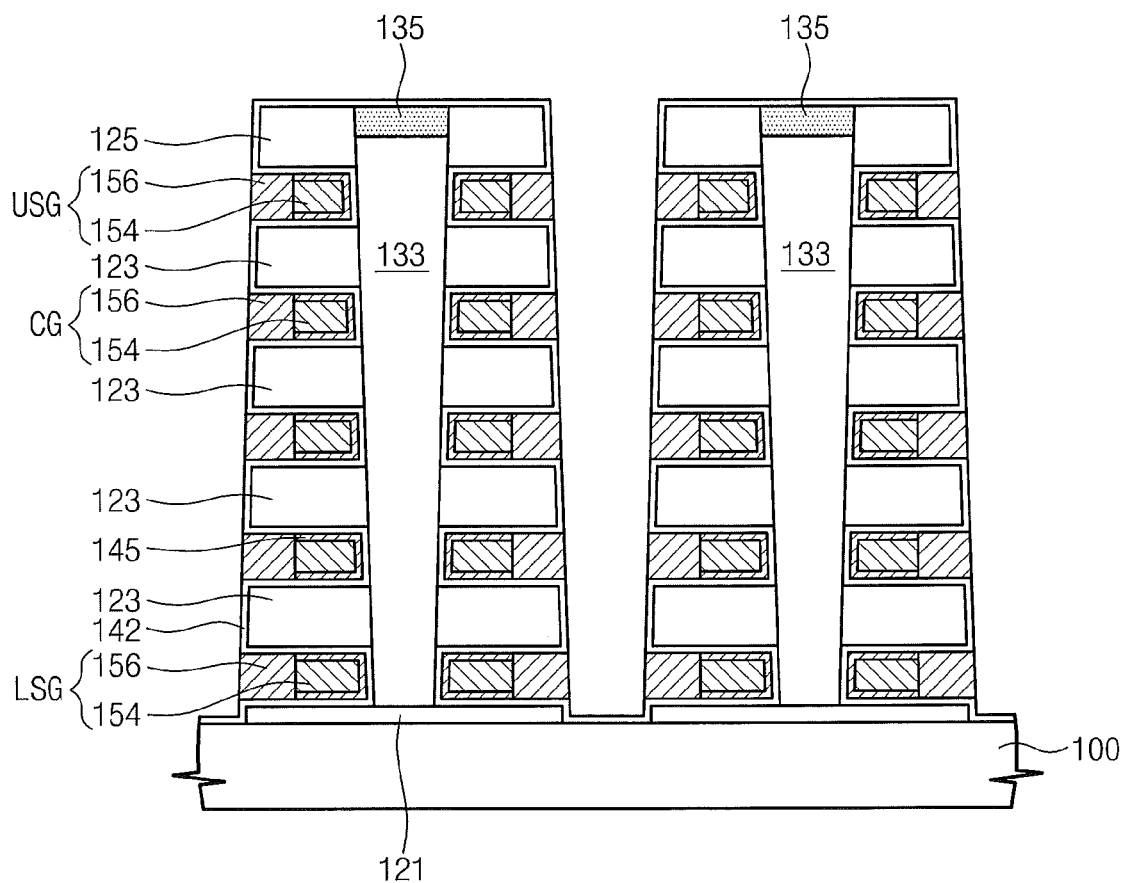

Referring to FIG. 2F, a second metal pattern 156 is formed from the etched surface of the first metal pattern 154. In particular, the second metal pattern 156 may be selectively formed from the etched surface of the first metal pattern 154. The first metal pattern 154 and the second metal pattern 156 formed in one opening may constitute one gate pattern LSG, CG, or USG. The gate pattern LSG that is nearest to the substrate 100 is a lower selection gate pattern, and the uppermost gate pattern USG among the gate patterns LSG, CG, and USG may be an upper selection gate pattern. Gate patterns between the lower selection gate LSG and the upper selection gate pattern USG may include memory cell gate patterns CG.

Selectively forming the second metal pattern 156 on the etched surface of the first metal pattern 154 may include supplying a second metal source and supplying a second reducing gas in a reaction chamber.

The second metal source may include a second metal. In some embodiments, the second metal source may include the same metal as the first metal source. For example, when the second metal source is $WF_6$ and the second reducing gas is $H_2$, reaction occurring in the reaction chamber may be the following chemical formula 2.

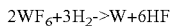
$2WF_6+3H_2 \rightarrow W+6HF$ (chemical formula 2)

The chemical reaction corresponding to the chemical formula 2 may preferentially occur on the etched surface of the first metal pattern 154. While not wishing to be bound by a particular theory of operation, the second metal source and the second reducing gas may be absorbed on the etched surface of the first metal pattern 154. The second reducing gas may be decomposed into an atomic state, and then the decomposed second reducing gas of an atomic state reacts to the absorbed second metal source, such that the second metal may be deposited on the etched surface of the first metal pattern 154.

The reaction for forming the second metal pattern 156 may be relatively slow. For example, the reaction for forming the second metal pattern 156 may progress slower than the reaction for forming the first metal layer 153. The second metal pattern 156 may have a lager grain size than the first metal pattern 154.

The forming process of the second metal pattern 156 may be performed under low temperature and low pressure conditions. For example, during the forming of the second metal pattern 156, a temperature in the reaction chamber may be below about 500° C. and a pressure in the reaction chamber may be below about 50 Torr. In some embodiments, during the forming of the second metal pattern 156, a temperature in the reaction chamber may be about 350° C. and a pressure in the reaction chamber may be about 40 Torr For starting the deposition of a metal atom, a metal source is provided at a deposition target layer and then accepts electrons from the deposition target layer. Because the metal source accepts electrons, a portion of atoms attached to the metal of the metal source may be separated from the metal source. For example, when $WF_6$ is used as the metal source, it may be separated into $WF_n$ and $F_6$-n (n is an integer less than 6) by electrons provided from the deposition target layer. The separated F may be bonded by sharing one atom, constituting the etching target layer, and the provided electron. The bonded one atom and F atom are removed from the deposition target layer in a gas state such that the metal is deposited on the deposition target layer.

During the deposition process of the metal atom, one factor that causes the metal atom to be deposited on the deposition target layer is that electrons are provided from the deposition target layer to the metal source. Accordingly, if the deposition target layer provides electrons easily, the deposition of the metal atom may progress smoothly. The degree that the deposition target layer provides electrons may be affected by the type of chemical bonding in the deposition target layer. The compounds constituting the deposition target layer may be combined through metallic bonds, covalent bonds, and/or ionic bonds. The compounds may be bonded by a plurality of bonding factors, but one of the plurality of combinations may be predominant. For example, the metallic bond may be predominant during bonding of metal atoms, and the covalent bond may be predominant during bonding of non-metal atoms. For convenience of description, atoms of a particular material are considered to be bonded by the most dominant bonding type among the various types of atomic bonds. If a compound constituting the deposition target layer is bonded by predominantly by ionic bonds, the deposition target layer may provide a relatively small amount of electrons to the metal source. In particular, if a compound constituting the deposition target layer has strong ionic bonds, the deposition target layer may not easily provide electrons to the metal source. In contrast, if a compound constituting the deposition target layer has strong metallic bonds, the deposition target layer may easily provide relatively more electrons to the metal source. Accordingly, if the metal layer is formed by providing the metal source to the deposition target layer, the formation of the metal layer can be controlled by the types of bonding found in the deposition target layer.

Accordingly, the deposition of the metal atoms for forming the second metal pattern may be performed selectively. The compound constituting the insulation pattern 142 may be bonded predominantly by strong ionic bonds. For example, the surface of the insulation pattern 142 exposed by the openings 150 may include an oxide. A compound including strong ionic bonds may provide less electrons to the second metal source. Accordingly, the second metal source and the second reducing gas may not be easily absorbed on the insulation pattern 142. In more detail, the reaction for deposition of the second metal layer 156 may include absorption of the second metal source and the second reducing gas. Accordingly, since the second metal source and the second reducing gas may not be easily absorbed on the insulation pattern 142, the second metal pattern 156 may not be easily formed on the insulation pattern 142.

On the contrary, since the first metal pattern 154 includes compounds formed predominantly by metallic bonds, the first metal pattern 154 may provide relatively more electrons to the second metal source. Accordingly, the second metal source and the second reducing gas may be preferentially absorbed on the first metal pattern 154. Thus, the second metals may be more easily deposited on the first metal pattern 154. By the degree difference of metal deposition speed, the second metal pattern 156 may be formed preferentially on the first metal pattern 154. Since the second metal pattern 156 grows selectively, it may not be necessary to perform a node isolation process for isolating the second metal patterns 156 in adjacent openings 150. Accordingly, defects of the second metal pattern 156, which may occur due to a node isolation process, may be avoided. In more detail, the second metal pattern 156 may have a relatively large grain size compared to the first metal pattern 154. Accordingly, a node isolation process could cause a large portion of the second metal pattern to be torn out, which may have a bad influence on a resistance property of the second metal pattern 156. However, according to embodiments of the inventive concept, the node isolation process may be omitted, such that defects of the second metal pattern 156, which would otherwise occur during the node isolation process, can be reduced or avoided. In addition, since the second metal patterns 156 may be electrically separated in the adjacent openings 150, it may be more completely insulated than adjacent gate patterns.

Figure 4A:
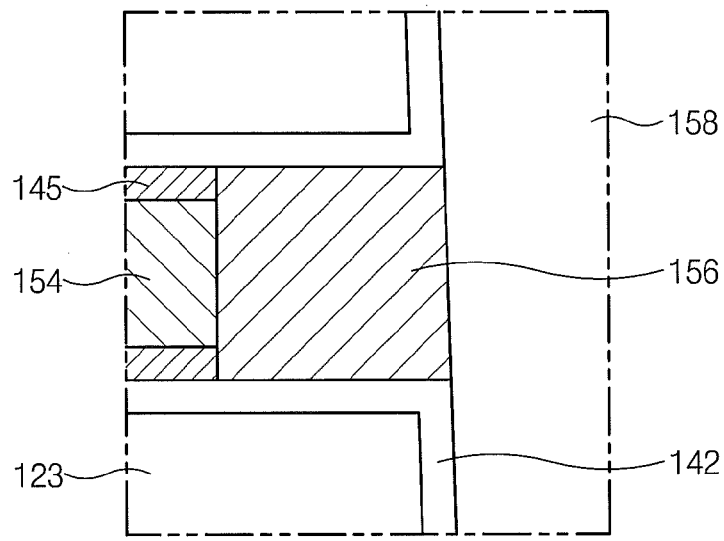
FIGS. 4A and 4B are enlarged views of an area A of FIG. 3.
Figure 4B:
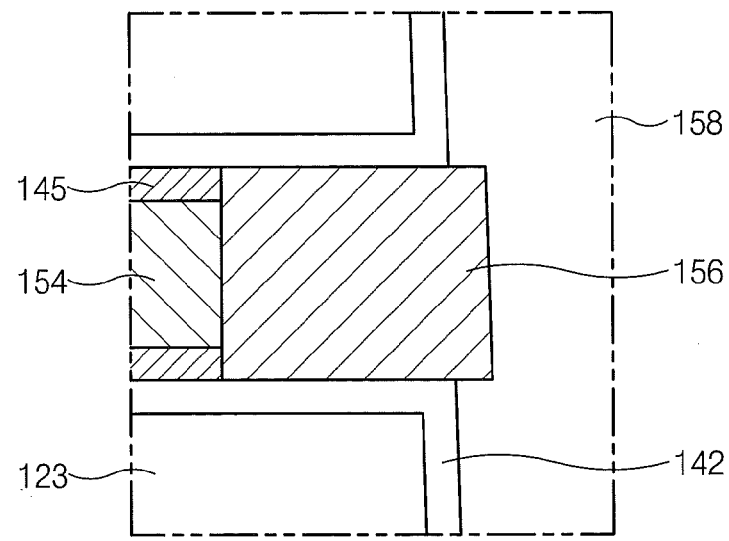

As shown in FIG. 4A, the second metal pattern 156 may grow up to be substantially even with the sidewall of the insulation pattern 142 on the sidewalls of the gate interlayer insulation layers 123. In other embodiments, as shown in FIG. 4B, the second metal pattern 156 may protrude beyond the sidewalls of the insulation pattern 142 on the sidewalls of the gate interlayer insulation layers 123. That is, the second metal pattern 156 may have overgrowth. Thereby, a resistance of the gate pattern including the second metal pattern 156 can be reduced. A resistance of the gate pattern can be adjusted by controlling the degree of growth of the second metal pattern 156.

Methods of forming the first metal pattern 154 and the second metal pattern 156 according to some embodiments of the inventive concept may reduce physical defects, such as void and seams, which may otherwise occur during the pattern formation process. As mentioned above, since the first metal pattern 154 is etched by wet etching, etching byproducts of the first metal pattern 154 (for example, metal atoms in the first metal source) that could pollute the insulation pattern 142 may be reduced. For example, etching byproducts that would otherwise become attached to the insulation pattern 142 and the second metal pattern 154 may be reduced. Since a second metal using the etching byproduct as a nucleus grows in a different direction than a second metal that grows from the first metal pattern 154, the second metal pattern 154 formed according thereto may have physical defects. Moreover, since the etching byproducts are formed irregularly on the insulation pattern 142, it may be difficult to control the second metal pattern 154 growing from the etching byproducts. However, according to some embodiments of the inventive concept, if the second metal pattern 156 is selectively formed from the first metal pattern 154, the second metal pattern 156 having reduced physical defects may be formed. Accordingly, the reliability of a semiconductor device including the second metal pattern 156 can be improved.

Figure 3:
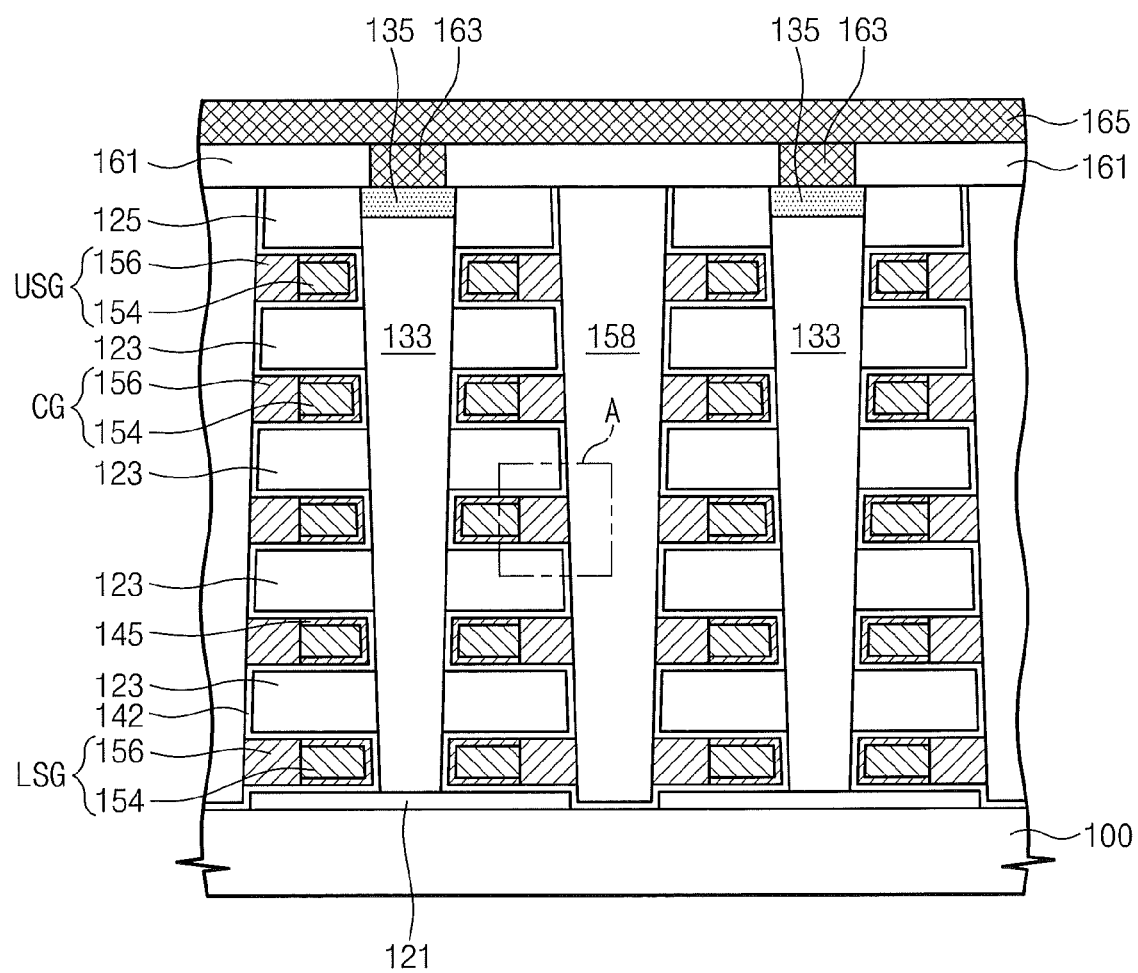
FIG. 3 is a sectional view taken along the line I-II of FIG. 1 illustrating a semiconductor device according to some embodiments of the inventive concept.

Referring to FIG. 3, a filling insulation layer 158 is formed to fill the groove 140. Due to the filling insulation layer 158, the first and second metal patterns 154 and 156 stacked sharing the one semiconductor structure 133 and the first and second metal patterns 154 and 156 stacked sharing adjacent another semiconductor structure 133 are separated. The top surface of the filling insulation layer 158 may be planarized. When it is planarized, portions of the upper insulation layer 125 and the insulation pattern 142 on the semiconductor structure 133 may be removed together. The planarization may be performed until the top surface of the upper insulation layer 125 and the top surface of the impurity region 135 in the semiconductor structure 133 are exposed.

An interlayer insulation layer 161 is formed on the semiconductor structure 133 and the upper insulation layer 125. A bit line contact hole penetrating the interlayer insulation layer 161 is formed. The bit line contact hole may expose the top surface of the impurity region 135. A bit line contact 163 is formed to fill the bit line contact hole. The bit line contact 163 may include a metal, a doped semiconductor, or a metal compound. A bit line 165 is formed on the interlayer insulation layer 161 and the bit line contact 163. The bit line 165 may extend in a second direction intersecting the first direction. The bit line contact 163 and the bit line 165 may be formed simultaneously or separately.

Referring to FIGS. 1, 3, 4A, and 4B, a semiconductor device according to an embodiment of the inventive concept will be described. The above contents described with reference to FIGS. 1, 2A through 2F, 3, 4A, and 4B may be omitted.

Referring to FIGS. 1 and 3, the semiconductor structure 133 is disposed on the substrate 100. The semiconductor structure 133 may have a pillar form that extends upwardly from the substrate 100. The semiconductor structure 133 may include a single crystal or polycrystalline semiconductor material. An impurity region 135 may be formed on the uppermost portion of the semiconductor structure 133. The impurity region 135 may be formed with a higher dopant concentration than other portions of the semiconductor structure 133.

The insulation layers 121, 123, and 125 may be stacked along the sidewall of the semiconductor structure 133. The insulation layers 121, 123, and 125 may include the underlying insulation layer 121 that is the most adjacent to the substrate 100, a plurality of gate interlayer insulation layers 123 on the underlying insulation layer 121, and the upper insulation layer 125 on the uppermost gate insulation layer 123. The insulation layers 121, 123, and 125 are separated from each other and may be disposed on the sidewall of the semiconductor structure 133.

An insulation pattern 142 is provided on sidewalls of the semiconductor structure 133 and the insulation layers 121, 123, and 125. The insulation pattern 142 may cover the sidewall of the semiconductor structure 133 between the insulation layers 121, 123, and 125 and the top surfaces, bottom surfaces and the sidewalls of the insulation layers 121, 123, and 125. The insulation pattern 142 may include a plurality of layers. The insulation pattern 142 may include an oxide layer, a nitride layer, or a combination thereof. For example, the insulation pattern 142 may be an ONO layer or an ONOA layer.

Openings 150 may be defined between adjacent insulation layers 121, 123, and 125. The openings 150 may be a space that is defined by the insulation pattern 142 between the adjacent insulation layers 121, 123, and 125. The openings 150 include the bottoms defined by the insulation pattern 142 on the sidewall of the semiconductor structure 133 and the sidewalls defined by the insulation pattern 142 on the top surfaces and bottom surfaces of the insulation layers 121, 123, and 125.

The openings 150 may be filled with a gate pattern. The gate pattern may include a first metal pattern 154 adjacent to the bottom of the openings 150 and a second metal pattern 156 on the sidewall of the first metal pattern 154.

Referring to FIG. 4A, one sidewall of the second metal pattern 156 may be coplanar with the sidewall of the insulation pattern 142 on the sidewalls of the insulation layers 121, 123, and 125 that are not adjacent to the semiconductor structure 133. In other embodiments, as shown in FIG. 4B, one sidewall of the second metal pattern 156 may protrude farther laterally than the sidewall of the insulation pattern 142 on the sidewalls of the insulation layers 121, 123, and 125. In still other embodiments, one sidewall of the second metal pattern 156 may be disposed within the openings 150. For example, the second metal pattern 156 may be more depressed than the sidewalls of the insulation layers 121, 123, and 125. The form of the second metal pattern 156 may be appropriately selected according to an applied device.

The first metal pattern 154 and the second metal pattern 156 may include the same metal. For example, the first metal pattern 154 and the second metal pattern 156 may include tungsten. The first metal pattern 154 may have a different grain size than the second metal pattern 156. For example, the grain size of the first metal pattern 154 may be smaller than that of the second metal pattern 156. Thereby, the first metal pattern 154 may have greater resistivity than the second metal pattern 156.

The barrier pattern 145 may be provided on the top surface and bottom surface of the first metal pattern 154. The barrier pattern 145 may extend between and separate the first metal pattern 154 and the semiconductor structure 133. The barrier pattern 145 may include at least one selected from metal compounds including TiN and WN.

One stacked layer structure including the semiconductor structure 133, the gate patterns, the insulation layers 121, 123, and 125, and the insulation patterns and a different stacked layer structure that is substantially similar to the one stacked layer structure may be disposed on the substrate 100. The filling insulation layer 158 may be disposed between the stacked layer structures. The filling insulation layer 158 may contact the insulation pattern 142 on the sidewalls of the insulation layers 121, 123, and 125 and one sidewall of the second metal pattern 156.

A bit line 165 is provided on the filling insulation layer 158, the upper insulation layer 125, and the semiconductor structure 133. The bit line 165 may be connected to the semiconductor structure 133 by the bit line contact 163. An interlayer insulation layer 161 may be further disposed between the bit line 165, and the upper insulation layer 125 and the filling insulation layer 158.

Figure 5A:
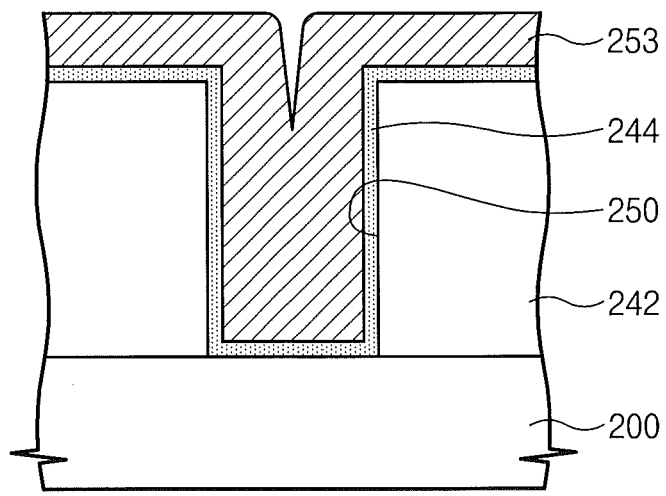
FIGS. 5A through 5C are manufacturing sectional views illustrating a semiconductor device according to further embodiments of the inventive concept.
Figure 5B:
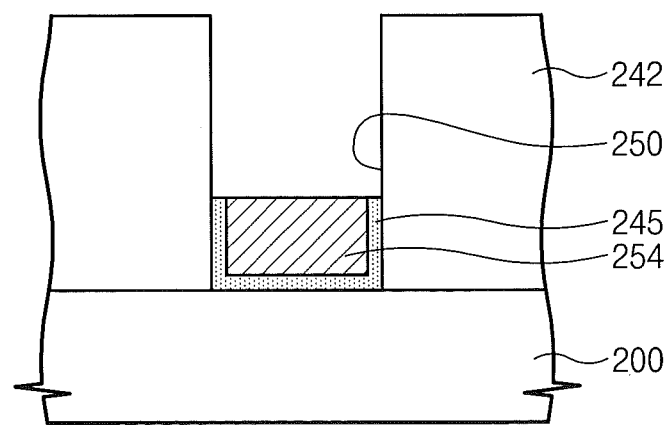
Figure 5C:
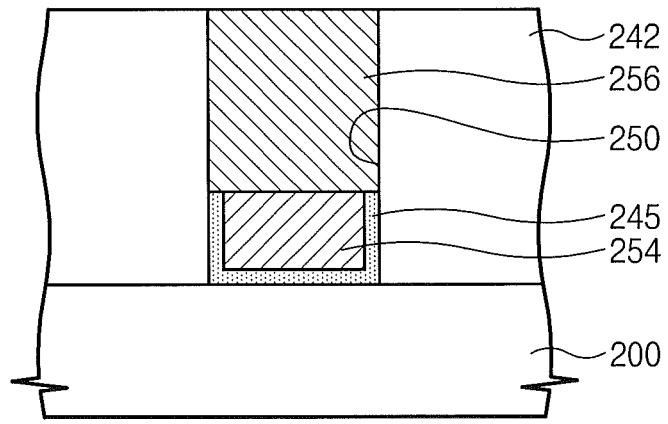

Referring to FIGS. 5A through 5C, a method of forming a semiconductor device according to further embodiments of the inventive concept will be described.

Referring to FIG. 5A, a semiconductor structure 200 is provided. The semiconductor structure 200 may be a semiconductor substrate, an epitaxial semiconductor layer, a silicon on insulator (SOI) layer or other semiconductor structure. The semiconductor structure 200 may include a conductive region and/or an insulating region. An insulation pattern 242 for defining an opening 250 is formed on the semiconductor structure 200. The insulation pattern 242 may include atoms bonded by an ionic bond. The insulation pattern 242 may include an oxide, for example. The opening 250 may expose the top surface of the semiconductor structure 200. For example, the opening 250 may expose the top surface of the conductive region of the semiconductor structure 200. The opening 250 may include the bottom defined by the top surface of the semiconductor structure 200 and the sidewall defined by the sidewall of the insulation pattern 242.

A barrier layer 244 may be formed in the opening 250. The barrier layer 244 may be conformally formed on the top surface of the exposed semiconductor structure 200 (the bottom of the opening 250), the sidewall of the opening 250, and the top surface of the insulation pattern 242. The barrier layer 244 may include a metal compound. For example, the barrier layer 244 may include TiN or WN.

A first metal layer 253 may be formed in the opening 250. The forming of the first metal layer 253 includes providing a first metal source and providing a first reducing gas in the reaction chamber. The first metal source may include a first metal. The first reducing gas may include hydrogen atoms, hydrogen radicals, and/or hydrogen ions. The first metal source and the first reducing gas may include materials having a relatively fast reaction. For example, the first metal source may be WF6 and the first reducing gas may be SiH4 or B2H6. Next, an embodiment that WF6 is used as the first metal source and SiH4 is used as the first reducing gas will be described. Reaction between the first metal source and the first reducing gas may be expressed with a reaction formula (a chemical formula 1 below).

$2WF_6 + 3SiH_4 \rightarrow 2W + 3SiF_4 + 6H_2$  (chemical formula 1)

$WF_6$ corresponds to the first metal source and $SiH_4$ corresponds to the first reducing gas in the chemical formula 1. The reaction of the first metal source and the first reducing gas may be relatively fast. Accordingly, the first metal layer 253 may be deposited at a fast speed. Likewise, the grain size of the first metal layer 253, which is deposited at a fast speed, may be relatively small.

Referring to FIG. 5B, the first metal layer 253 and the barrier layer 244 may be wet-etched. The first metal layer 253 and the barrier layer 244 may be etched by an etching solution including at least one of $H_2O_2$, $H_3PO_4$, $HNO_3$, $CH_3COOH$, HF, HCl, $H_2SO_4$, EKC, $SF_6$, $Cl_2$, and $NF_3$. The first metal pattern 254 and the barrier pattern 245 may be formed by the wet etching. The first metal pattern 254 and the barrier pattern 245 may have a lower top surface than the insulation pattern 242. The sidewall of the opening 250 may be partially exposed by the wet etching. That is, the sidewall of the insulation pattern 242 may be partially exposed.

Referring to FIG. 5C, the second metal pattern 256 may be selectively formed. The second metal pattern 256 may grow anisotropically on the first metal pattern 254.

Selectively forming the second metal pattern 256 on the etched surface of the first metal pattern 254 may include supplying a second metal source and supplying a second reducing gas in the reaction chamber.

In an embodiment, the second metal source may include the same metal as the first metal source. For example, if the second metal source is $WF_6$ and the second reducing is $H_2$, reaction occurring in the reaction chamber may be the following chemical formula 2.

$2WF_6 + 3H_2 \rightarrow W + 6HF$  (chemical formula 2)

The chemical reaction corresponding to the chemical formula 2 may occur on the etched surface of the first metal pattern 254. The second metal source and the second reducing gas may be absorbed on the etched surface of the first metal pattern 254. The second reducing gas is decomposed into an atomic state, and the decomposed second reducing gas of an atomic state reacts to the second metal source such that the second metal may be deposited on the etched surface of the first metal pattern 254.

The reaction for forming the second metal pattern 256 may be relatively slow. For example, the reaction for forming the second metal pattern 256 may progress more slowly than the reaction for forming the first metal layer 253.

In these embodiments, in order to slow down the reaction speed of the second material source and the second reducing gas, the second metal source may be provided in greater amounts than the reducing gas. The forming process of the second metal pattern 256 may be performed under low temperature and low pressure conditions. For example, during the forming of the second metal pattern 256, a temperature in the reaction chamber may be below about 500° C. and a pressure in the reaction chamber may be below about 50 Torr. In an embodiment, during the forming of the second metal pattern 256, a temperature in the reaction chamber may be about 350° C. and a pressure in the reaction chamber may be about 40 Torr.

Referring to FIG. 5C again, a semiconductor device according to further embodiments of the inventive concept will be described. The contents described with reference to FIGS. 5A through 5C will be partially omitted.

An insulation pattern 242 may be disposed on the semiconductor structure 200. The semiconductor structure 200 may include a conductive region and/or an insulating region. The insulation pattern 242 may define an opening 250 that exposes at least portion of the conductive region of the semiconductor structure 200.

The first metal pattern 254 and the second metal pattern 256 may be disposed in the opening 250. The first metal pattern 254 is disposed at the bottom of the opening 250 adjacent to the semiconductor structure 200 and the second metal pattern 256 may be disposed on the first metal pattern 254 in the opening 250.

The first metal pattern 254 and the second metal pattern 256 may include the same metal element. For example, the first metal pattern 254 and the second metal pattern 256 may include tungsten. The first metal pattern 254 and the second metal pattern 256 may have different average grain sizes. For example, the grain size of the first metal pattern 254 may be smaller than that of the second metal pattern 256. Thereby, the first metal pattern 254 may have greater resistivity than the second metal pattern 256.

A barrier pattern 245 may be interposed between the first metal pattern 254 and the insulation pattern 242. The top surface of the barrier pattern 245 and the top surface of the first metal pattern 254 may be coplanar.

Figure 6:
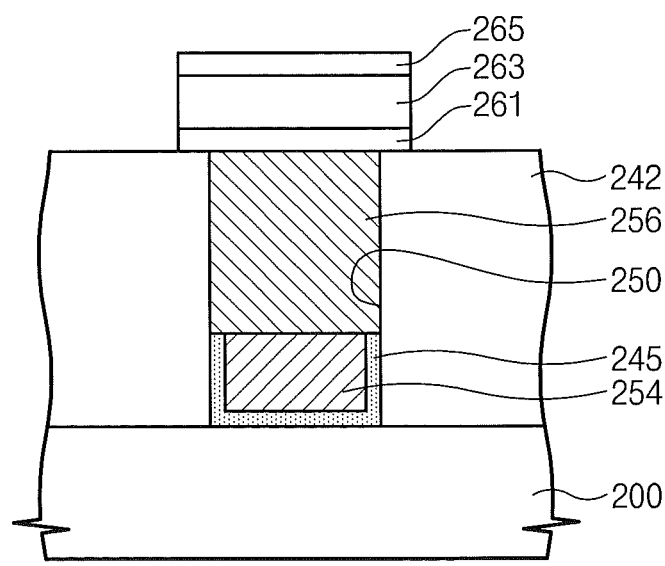
FIGS. 6 and 7 are views illustrating application examples of semiconductor devices according to further embodiments of the inventive concept.
Figure 7:
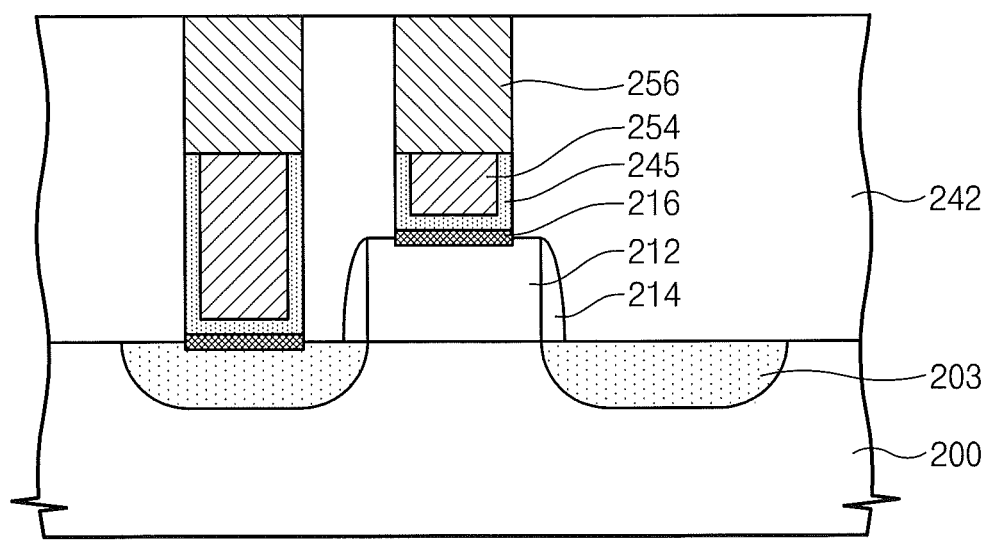

Referring to FIGS. 6 and 7, application examples of a semiconductor device according to other embodiments of the inventive concept will be described.

Referring to FIG. 6, a variable resistance layer 263 is disposed on the second metal pattern 256 of FIG. 5C. The variable resistance layer 263 may include a phase change material, a transition metal oxide, or a plurality of magnetic layers. In this case, the first metal pattern 254 and the second metal pattern 256 may serve as a first contact plug.

A top electrode 265 and a bottom electrode 261 may be respectively disposed on the top and bottom of the variable resistance layer 263. The bottom electrode 261 may be interposed between the variable resistance layer 263 and the second metal pattern 256. The bottom electrode 261 may be omitted according to a property of the variable resistance layer 263.

Referring to FIG. 7, the first metal pattern 254, the second metal pattern 256, and the barrier pattern 245 of FIG. 5C may electrically contact the top surfaces of the gate 212 and the impurity region 203 constituting a transistor. In this case, the first metal pattern 254 and the second metal pattern 256 may serve as a contact plug. An ohmic layer 216 may be further interposed between the barrier pattern 245 and the impurity region 203 and/or between the barrier pattern 245 and the gate 212.

Figure 8:
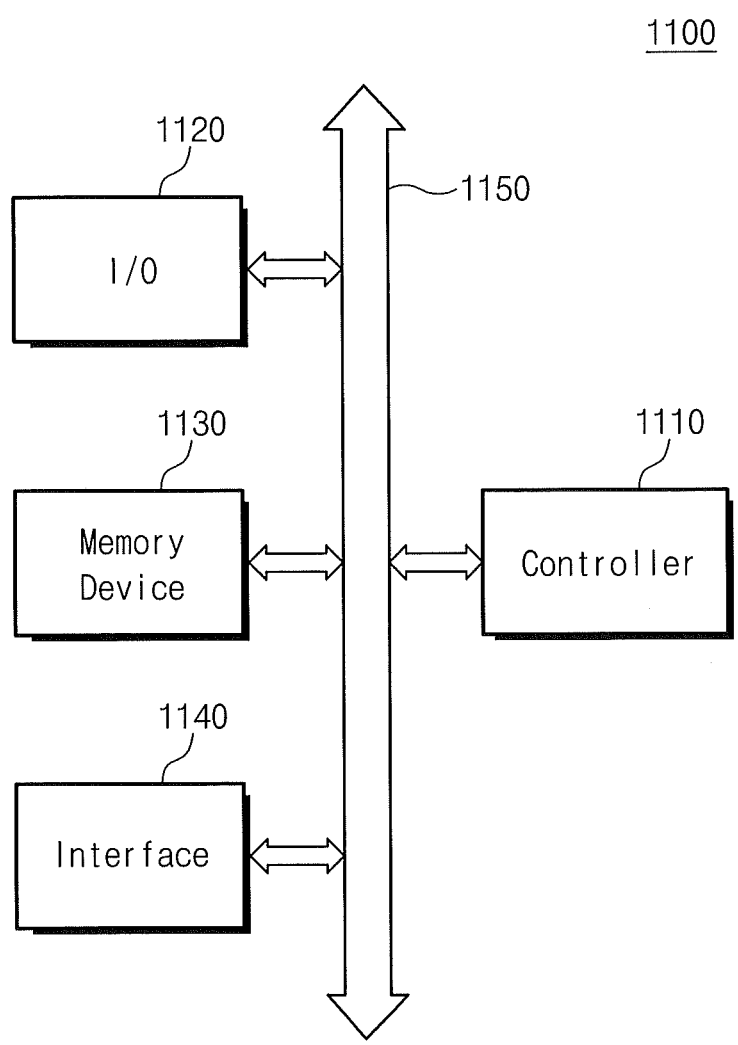
FIGS. 8 and 9 are views illustrating application examples of the embodiments of the inventive concept.

Referring to FIG. 8, an electronic system 1100 may include a controller 1110, an input/output (I/O) 1120, a memory device 1130, an interface 1140, and a bus 1150. The controller 1110, the I/O 1120, the memory device 1130, and/or the interface 1140 may be electrically connected through the bus 1150. The bus 1150 corresponds to a path through which data may be transferred. The controller 1110 may include at least one of a microprocessor, a digital signal processor, a microcontroller, and/or logic devices performing equivalent functions thereof. The I/O 1120 may include a keypad, a keyboard, and a display device. The memory device 1130 may store data and/or commands. The memory device 1130 may include at least one of the semiconductor memory devices disclosed in the above first and second embodiments. In addition, the memory device 1130 may further include a semiconductor memory device of a different form (for example, a flash memory device, a DRAM, and/or SRAM) The interface 1140 may perform a function for transmitting data to a communication network or receiving data from a communication network. The interface 1140 may be a wire or wireless interface. For example, the interface 1140 may include an antenna or a wire/wireless transceiver. Although not illustrated, the electronic system 1100 may further include a high-speed DRAM and/or SRAM as an operating memory to improve an operation of the controller 1110

The electronic system 1100 may be applied to a personal digital assistant (PDA), a portable computer, a web tablet, a wireless phone, a mobile phone, a digital music player, a memory card, or all kinds of electronic products for transmitting and/or receiving information via a wireless environment.

Figure 9:
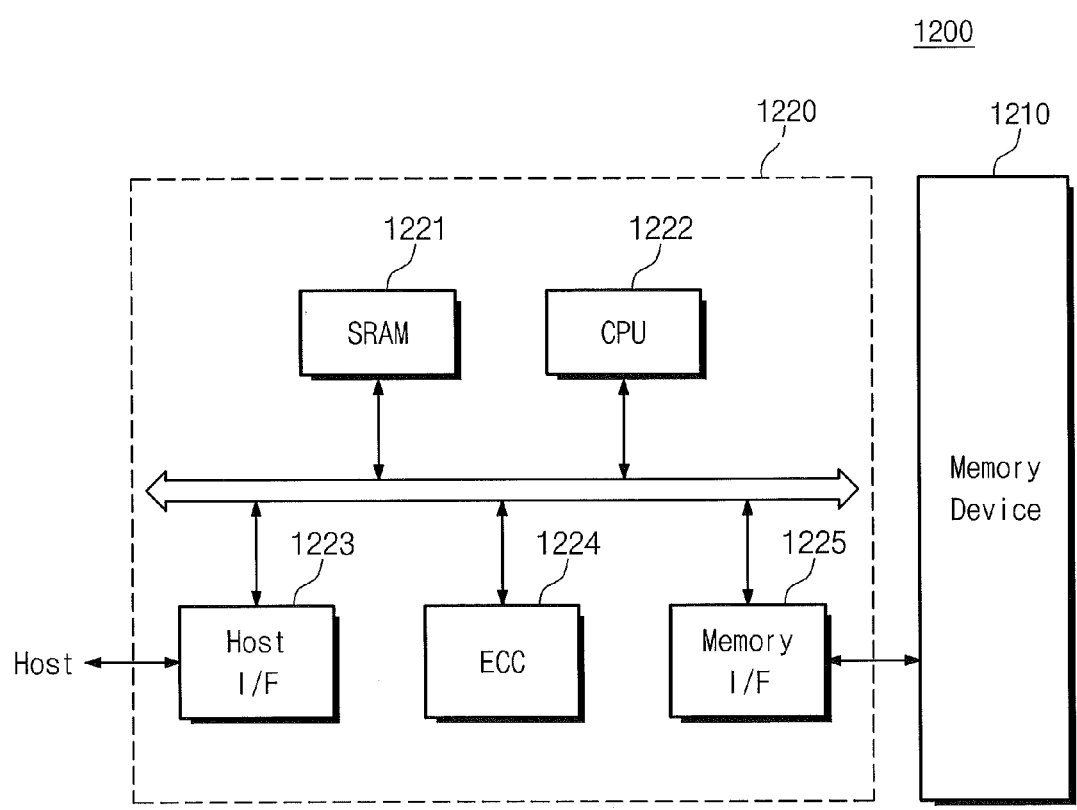

FIG. 9 is a block diagram illustrating a memory card including a semiconductor memory device according to an embodiment of the inventive concept.

Referring to FIG. 9, a memory card 1200 according to an embodiment of the inventive concept includes a memory device 1210. The memory device 1210 may include at least one of the semiconductor memory devices of the first and second embodiments. The memory device 1210 may further include another form of a semiconductor memory device (for example, a flash memory device, a DRAM, and/or SRAM). The memory card 1200 may include a memory controller 1220 for controlling data exchange between a host and the memory device 1210.

The memory controller 1220 may include a central processing unit (CPU) 1222 for controlling general operations of the memory card 1200. Or, the memory controller 1220 may include a SRAM 1221 that serves as an operating memory of the CPU 1222. Furthermore, the memory controller 1220 may further include a host interface (I/F) 1223 and a memory I/F 1225. The host I/F 1223 may include a data exchange protocol between the memory card 1200 and a host. The memory I/O 1225 may connect the memory controller 1220 with the memory device 1210. Furthermore, the memory controller 1220 may further include an error correction circuit (ECC) 1224. The ECC 1224 detects and corrects an error of data read from the memory device 1210. Although not illustrated in the drawings, the memory card 1200 may further include a ROM device for storing code data to interface with a host. The memory card 1200 may used as a portable data storage card. Alternatively, the memory card 1200 may be realized with a solid state disk (SSD) that may replace a hard disk of a computer system.

According to some embodiments of the inventive concept, a first metal layer is formed in an opening and then is wet-etched. A second metal pattern is selectively grown from the wet-etched first metal layer. If the first metal layer is etched by the wet etching, an etching impurity is applied to the sidewall of the opening, such that the second metal pattern is grown preferentially from the first metal layer rather than sidewalls of the opening. Accordingly, metal patterns having reduced defects may be formed in the opening. Additionally, the second metal pattern is selectively grown such that it is formed being separated from an adjacent second metal pattern. Therefore, two respectively adjacent second metal patterns may be formed in a manner that they remain insulated from each other. Accordingly, a semiconductor device having an improved reliability can be formed.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A semiconductor device comprising:
   a substrate;
   gate interlayer insulation layers and gate patterns alternately stacked on the substrate;
   a semiconductor structure extending upwardly from the substrate along sidewalls of the gate interlayer insulation layers and the gate patterns; and
   an insulation pattern between the gate patterns and the semiconductor structure,
   wherein the gate patterns comprise a first metal pattern and a second metal pattern, the first metal pattern being adjacent to the semiconductor structure, wherein the second metal pattern is in direct contact with the first metal pattern and is spaced apart from the semiconductor structure by the first metal pattern.

2. The semiconductor device of claim 1, wherein an average grain size of the first metal pattern is smaller than an average grain size of the second metal pattern.

3. The semiconductor device of claim 2, wherein the second metal pattern defines a second sidewall of the gate patterns facing a first sidewall of the gate patterns adjacent to the semiconductor structure; the second metal pattern protruding more than the insulation pattern on the second sidewall of the gate patterns.

4. The semiconductor device of claim 1, wherein the insulation pattern extends on the top and bottom surfaces of the gate patterns.

5. The semiconductor device of claim 1, further comprising a barrier layer between the first metal pattern and the insulation pattern, where one side of the barrier layer opposite the semiconductor structure is coplanar with one side of the first metal pattern.

6. The semiconductor device of claim 1, wherein the insulation pattern comprises Oxide-Nitride-Oxide-Aluminum Oxide (ONOA).

7. The semiconductor device of claim 1, wherein the insulation pattern comprises a charge storage layer.

8. The semiconductor device of claim 1, wherein the insulation pattern provides a gate insulation layer between the first metal pattern and an active pattern in the semiconductor structure in which a channel region of the transistor is provided.

9. A semiconductor device comprising:
   a substrate;
   gate interlayer insulation layers and gate patterns alternately stacked on the substrate;
   a semiconductor structure extending upwardly from the substrate along sidewalls of the gate interlayer insulation layers and the gate patterns, wherein the semiconductor structure penetrates the gate patterns; and
   an insulation pattern between the gate patterns and the semiconductor structure;
   wherein the gate patterns comprise a first metal pattern and a second metal pattern, the first metal pattern being adjacent to the semiconductor structure, wherein the second metal pattern is spaced apart from the semiconductor structure by the first metal pattern.

10. The semiconductor device of claim 9, wherein the first metal pattern is electrically connected to the second metal pattern.

11. The semiconductor device of claim 9, wherein the gate patterns extend along a first direction that crosses a second direction along which the semiconductor structure extends.

12. The semiconductor device of claim 9, wherein an average grain size of the first metal pattern is smaller than an average grain size of the second metal pattern.

13. The semiconductor device of claim 9, wherein the second metal pattern defines a second sidewall of the gate patterns facing a first sidewall of the gate patterns adjacent to the semiconductor structure, and wherein the second metal pattern protrudes more than the insulation pattern on the second sidewall of the gate patterns.

14. The semiconductor device of claim 9, further comprising a barrier layer between the first metal pattern and the insulation pattern, where one side of the barrier layer opposite the semiconductor structure is coplanar with one side of the first metal pattern.

* * * * *